US012660402B2

(12) United States Patent
Kim et al.

(10) Patent No.: US 12,660,402 B2
(45) Date of Patent: Jun. 16, 2026

(54) LED LIGHTING DEVICE AND METHOD FOR MANUFACTURING THE SAME

(71) Applicant: DONGWOO FINE-CHEM CO., LTD., Iksan-si (KR)

(72) Inventors: Byoungin Kim, Seoul (KR); Dong Ki Keum, Seoul (KR); Jin Lee, Pyeongtaek-si (KR)

(73) Assignee: DONGWOO FINE-CHEM CO., LTD., Iksan-si (KR)

( * ) Notice: Subject to any disclaimer, the term of this patent is extended or adjusted under 35 U.S.C. 154(b) by 370 days.

(21) Appl. No.: 18/278,297

(22) PCT Filed: Feb. 24, 2022

(86) PCT No.: PCT/KR2022/002718
§ 371 (c)(1),
(2) Date: Aug. 22, 2023

(87) PCT Pub. No.: WO2022/182167
PCT Pub. Date: Sep. 1, 2022

(65) Prior Publication Data
US 2024/0128304 A1 Apr. 18, 2024

(30) Foreign Application Priority Data
Feb. 25, 2021 (KR) ........................ 10-2021-0025366

(51) Int. Cl.
*H10H 29/14* (2025.01)
(52) U.S. Cl.
CPC .................................. *H10H 29/142* (2025.01)

(58) Field of Classification Search
CPC . H10H 29/142; H01L 25/0753; C08J 2367/02
See application file for complete search history.

(56) References Cited

U.S. PATENT DOCUMENTS

2022/0262853 A1* 8/2022 Yamada .............. H10H 29/142

FOREIGN PATENT DOCUMENTS

| KR | 10-2012-0029173 A | 3/2012 |
|----|-------------------|--------|
| KR | 10-2012-0083714 A | 7/2012 |
| KR | 10-2014-0061015 A | 5/2014 |
| KR | 10-2014-0076485 A | 6/2014 |
| KR | 10-2015-0104462 A | 9/2015 |
| KR | 10-2018-0022861 A | 3/2018 |
| KR | 10-2018-0050189 A | 5/2018 |
| KR | 10-2018-0067068 A | 6/2018 |
| KR | 10-2019-0021223 A | 3/2019 |
| KR | 10-2020-0042584 A | 4/2020 |

OTHER PUBLICATIONS

International Search Report for PCT/KR2022/002718 dated Oct. 5, 2022 (PCT/ISA/210).

* cited by examiner

*Primary Examiner* — Changhyun Yi
(74) *Attorney, Agent, or Firm* — Sughrue Mion, PLLC

(57) ABSTRACT

A method for manufacturing an LED lighting device includes forming a separation film on a substrate, patterning the separation film, forming LEDs on the separation film, bonding a stretch film to top surfaces of the LEDs and spacing between the LEDs, separating the separation film from the substrate, stretching the stretch film, exposing the top surfaces of the LEDs, and forming electrodes on the top surfaces of the LEDs, and a bottom surface of the separation film or bottom surfaces of the LEDs.

21 Claims, 2 Drawing Sheets

【Figure 1】
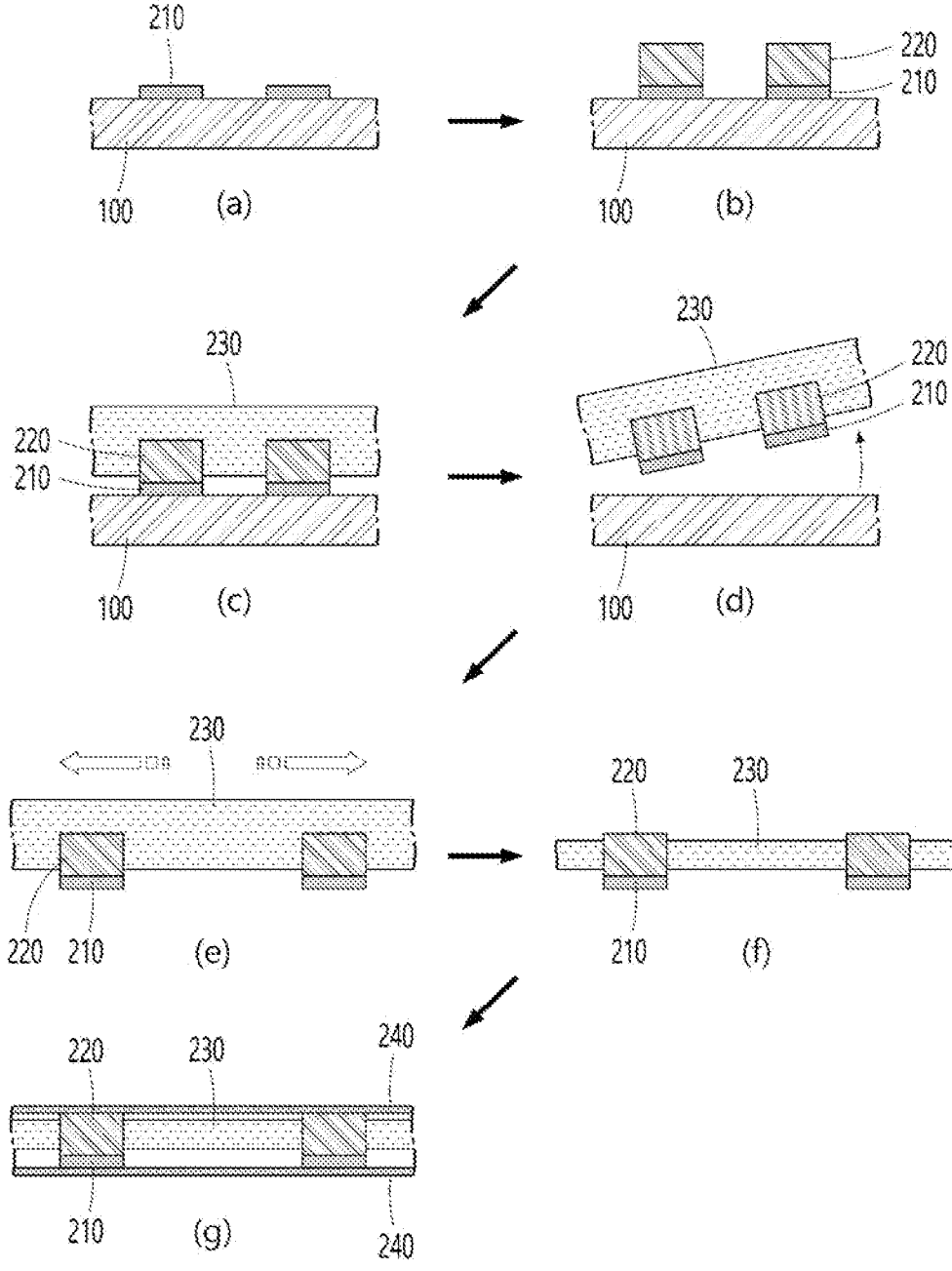

【Figure 2A】
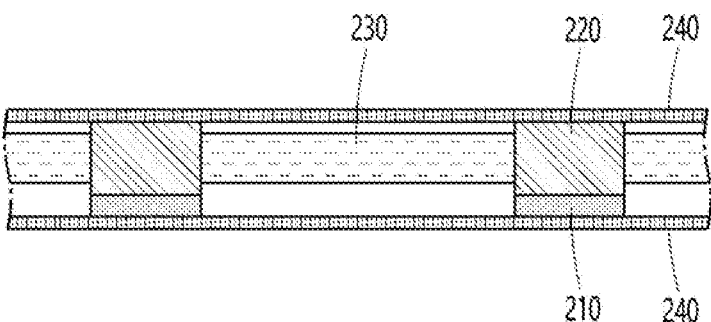
【Figure 2B】
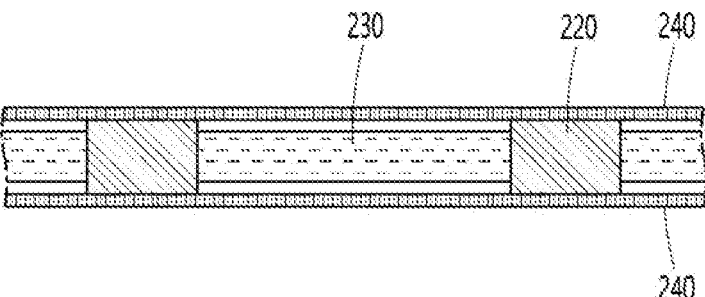

LED LIGHTING DEVICE AND METHOD FOR MANUFACTURING THE SAME

CROSS REFERENCE TO RELATED APPLICATIONS

This is a National Stage of International Application No. PCT/KR2022/002718 filed Feb. 24, 2022, claiming priority based on Korean Patent Application No. 10-2021-0025366 filed Feb. 25, 2021.

TECHNICAL FIELD

The present invention relates to a light emitting diode (LED) lighting device. Particularly, the present invention relates to an LED lighting device that improves light uniformity by uniformly arranging LEDs in micro-scale, and a method for manufacturing the same.

BACKGROUND ART

LEDs have the advantages of high brightness, low heat, long life, environmental friendliness, and recyclability, and have been called the next generation of green lighting with the most promising development prospects in the 21st century.

Conventional LED lighting devices are manufactured by fixing an LED chip on a substrate to combine the LED chip electrode and the substrate electrode, fixing the LED chip and the substrate to the cup bottom of a support reflective cup, and connecting the electrodes of the fixed substrate to the electrodes of the support using wires.

However, the manufacturing method of LED lighting devices has limitations in narrowing the spacing of LED chips even if they are arranged as densely as possible, making it virtually impossible to manufacture micro-scale LED lighting devices.

In addition, conventional methods of manufacturing LED lighting devices have wide spacing between the LED chips, which can cause the LED chips to be visible, and in this case, additional diffusion parts are often combined, which causes the cost to increase.

DISCLOSURE OF INVENTION

Technical Problem

An object of the present invention is to provide an LED lighting device and a manufacturing method thereof that can improve light uniformity by uniformly arranging LEDs in micro-scale.

Another object of the present invention is to provide a durable and efficient LED lighting device and a method for manufacturing the same.

Technical Solution

A method for manufacturing a light emitting diode (LED) lighting device of the present invention for achieving this purpose may include forming a separation film on a substrate, patterning the separation film, forming LEDs on the separation film, bonding a stretch film to top surfaces of the LEDs and spacing between the LEDs, separating the separation film from the substrate, stretching the stretch film, exposing the top surfaces of the LEDs, and forming electrodes on the top surfaces of the LEDs, and a bottom surface of the separation film or bottom surfaces of the LEDs.

In the method for manufacturing an LED lighting device according to the present invention, forming the separation film may form the separation film with a thickness of 0.2 to 1.1 nm.

In the method for manufacturing an LED lighting device according to the present invention, forming the separation film may form the separation film by stacking graphene crystalline thin films in 1 to 5 layers.

In the method for manufacturing an LED lighting device according to the present invention, forming the separation film may include forming the separation film on a copper foil, and transferring the separation film to the substrate.

In the method for manufacturing an LED lighting device according to the present invention, patterning the separation film may include selectively removing the separation film by location or selectively forming shields on the separation film by location.

Forming LEDs on the separation film may include crystal-growing a semiconductor layer having the same crystal structure as that of the substrate.

In the method for manufacturing an LED lighting device according to the present invention, bonding the stretch film to the top surfaces of the LEDs and the spacing between the LEDs may include heat-pressing the stretch film.

In the method for manufacturing an LED lighting device according to the present invention, stretching the stretch film may include shape-locking the stretch film in a stretched state.

In the method for manufacturing an LED lighting device according to the present invention, exposing the top surfaces of the LEDs may include removing a portion of the stretch film.

In the method for manufacturing an LED lighting device according to the present invention, removing a portion of the stretch film may include dry etching the stretch film.

In the method for manufacturing an LED lighting device according to the present invention, forming the electrodes on the top surfaces of the LEDs, and the bottom surface of the separation film or the bottom surfaces of the LEDs may include laminating a conductive film to the top surfaces of the LEDs, and the bottom surface of the separation film or the bottom surfaces of the LEDs.

An LED lighting device according to the present invention may include a plurality of LEDs arranged spaced apart, a stretch film formed in spacing between the LEDs, and an electrode in the form of a film laminated to the LEDs.

The LED lighting device according to the present invention may further include a separation film bonded to one side of the LED.

In the LED lighting device according to the present invention, the separation film may have a thickness of 0.2 to 1.1 nm.

In the LED lighting device according to the present invention, the separation film may have a structure in which graphene crystalline thin films are stacked in 1 to 5 layers.

In the LED lighting device according to the present invention, the stretch film may use a polymeric organic material with a difference of 40° C. or more between a melting point and deformation temperature at tensile strength of 0.46 Mpa. In this case, the polymeric organic material may be selected from ABS resin, nylon 6, polycarbonate, polyethylene, HDPE, PET, polypropylene, and polystyrene.

In the LED lighting device according to the present invention, the stretch film may use a polymeric organic material with a difference of 60° C. or more between a melting point and deformation temperature at tensile strength of 0.46 Mpa. In this case, the polymeric organic material may be selected from ABS resin, nylon 6, polycarbonate, PET, polypropylene, and polystyrene.

In the LED lighting device according to the present invention, the polymeric organic material may be selected from ABS resin, PET, and polystyrene.

In the LED lighting device according to the present invention, PET may be used as the polymeric organic material.

In the LED lighting device according to the present invention, the stretch film may be fusedly inserted into the spacing of the LEDs.

Advantageous Effects

With such a configuration, the present invention allows the LEDs to be uniformly arranged on a micro-scale through the stretch film, which can greatly increase light uniformity.

By fusing the stretch film to the LED spacing, the present invention can significantly increase the durability of the lighting device.

Furthermore, the present invention can provide high efficiency similar to the surface light source characteristics of organic ELs by using the stretch film to fix the LEDs in a uniform and densely spaced manner.

DESCRIPTION OF DRAWINGS

FIG. 1 is a process cross-sectional view illustrating a manufacturing process of an LED lighting device according to the present invention.

FIGS. 2A and 2B are cross-sectional views illustrating first and second embodiments of an LED lighting device according to the present invention, respectively.

BEST MODE

Hereinafter, the present invention will be described in more detail with reference to the accompanying drawings.

FIG. 1 is a process cross-sectional view illustrating a manufacturing process of an LED lighting device according to the present invention.

As shown in (a) of FIG. 1, in a manufacturing method of an LED lighting device according to the present invention, a separation film 210 is first formed on a substrate 100, and the separation film 210 may be patterned by selectively removing by location.

The substrate 100 may be a silicon substrate or the like.

The separation film 210 is used to separate LEDs 220 from the substrate 100, which may be a conductor or an insulator. If formed of a conductor, the separation film 210 may be composed of Cu, Ni, Ag, Au, Co, Cu—Co, Ni—Co, Cu—Mo, Ni/Cu, Ni/Cu—Mo, graphene, or the like. If formed of an insulator, the separation film 210 may be composed of a polymeric organic film, for example, polyimide, polyvinyl alcohol, polyamic acid, polyamide, polyethylene, polystyrene, polynorbornene, and the like. The separation film 210 can be formed by deposition, for example, using methods such as electro-deposition, electroless-deposition, chemical vapor deposition (CVD), plasma enhanced chemical vapor deposition (PECVD), physical vapor deposition (PVD), plasma spray, and the like.

The separation film 210 is preferably constructed as thin as possible because the crystal structure of the substrate 100 should influence the crystal growth of the LED 220 when crystal-growing the LED 220 thereon. If the thickness of the separation film 210 exceeds 1.1 nm, it will hinder the LED 220 formed thereon from growing into a crystal structure that is identical to the crystal structure of the substrate 100. Accordingly, it may be desirable to configure the separation film 210 to have a thickness of 1.1 nm or less.

The separation film 210 may be preferably composed of a heat-resistant material, as heat may be applied to the substrate 100, the LED 220, and the like in a subsequent process.

As such, the separation film 210 must be able to be constructed as a thin film and be heat resistant, and the material that best satisfies these conditions is graphene. Graphene has a thickness of about 0.2 nm for a single layer of crystalline thin film. In this case, if the separation film 210 is formed of graphene, the thickness of the separation film 210 may be formed in the range of 0.2 to 1.0 nm by stacking five layers of graphene crystalline thin film up to the upper limit of the thickness of the separation film 210, which is 1.1 nm.

If the separation film 210 is composed of graphene, the separation film 210 can be formed by forming one to five layers of graphene crystalline thin films on a copper foil and then transferring them to the substrate 100.

As shown in (b) of FIG. 1, the LEDs 220 can be formed on the separation film 210, respectively. The LED 220 is a light emitting layer and may include an n-type semiconductor layer, an active layer, a p-type semiconductor layer, and the like.

The n-type semiconductor layer may be formed by growing an n-type GaN layer, and silicon (Si) or the like may be used as the n-type dopant.

The active layer can be formed on the n-type semiconductor layer. The active layer may be a double heterostructure, a single quantum well, or multiple quantum wells.

The p-type semiconductor layer can be formed by growing a p-type GaN layer on the active layer. The p-type dopant may be magnesium (Mg) or the like.

The n-type semiconductor layer, active layer, and p-type semiconductor layer constituting the LED 220 may be crystal-grown layers having the same crystal structure as that of the substrate 100. The crystal growth can be performed, for example, using metal organic chemical vapor deposition (MOCVD). This allows the LEDs 220 to grow vertically upward from the separation film 210, and as a result, prevents the LEDs 220 from contacting, and thus shorting, closely spaced neighboring LEDs.

As shown in (c) of FIG. 1, a stretch film 230 can be bonded to the top surface of the LEDs 220. In this step, pressing the stretch film 230 while applying heat to the stretch film 230 or the substrate 100 can cause the stretch film to be inserted into the spacing of the LED 220s. In this way, the stretch film 230 can rigidly support a plurality of LEDs 220 in a spaced and insulated state.

The stretch film 230 can be made of a polymeric organic material having an elongation in the range of 200% to 500%, for example.

The stretch film 230 may undergo a process of insertion into the spacing of the LEDs 220 and a process of stretching, with the insertion process occurring at or above the deformation temperature and the stretching process occurring at or below the melting point. Due to this difference in process temperature between insertion and stretching, it may be advantageous for the material of the stretch film 230 to have a larger difference between the deformation temperature and the melting point.

Table 1 below compares the deformation temperatures and melting points of several polymeric organic materials. Here, the deformation temperature is usually measured at tensile strengths of 0.46 Mpa and 1.8 Mpa. In the present invention, since it is desirable to use a material with good ductility, the value measured at a tensile strength of 0.46 Mpa was used.

TABLE 1

| Type | Deformation temperature (° C.) | Melting point (° C.) | Temperature difference (° C.) |
|---|---|---|---|
| ABS | 98 | 200 | 102 |
| Acetal copolymer | 160 | 160-184 | 0 |
| Acrylic | 95 | 130 | 35 |
| Nylon 6 | 160 | 220 | 60 |
| Polycarbonate | 140 | 230-260 | 90 |
| Polyethylene | 85 | 130 | 45 |
| High density polyethylene (HDPE) | 85 | 130 | 45 |
| PET | 70 | 250 | 180 |
| Polypropylene | 100 | 160 | 60 |
| Polystyrene | 95 | 270 | 175 |

Among the polymeric organic materials exemplified above, acetal copolymer and acrylic with a temperature difference of less than 40° C. were difficult to apply to the actual process because the temperature difference was too small to perform the insertion process and the stretching process separately. Therefore, among the polymeric organic materials exemplified above, ABS resin, nylon 6, polycarbonate, polyethylene, HDPE, PET, polypropylene, and polystyrene can be selected and used.

Furthermore, as a result of performing the actual process, it was easy to separate the insertion process and the stretching process when the temperature difference was 60° C. or more. Accordingly, in the present invention, it may be preferable to select from ABS resin, nylon 6, polycarbonate, PET, polypropylene, and polystyrene among the above-mentioned polymeric organic materials.

On the other hand, when the process is actually carried out, a high process temperature makes it difficult to maintain the process and increases the manufacturing cost. Thus, when the condition of the temperature difference of 60° C. or more is met, it may be desirable that both the deformation temperature and the melting point are low, and especially that the deformation temperature is low. From this point of view, in the present invention, it may be preferable to select from ABS resin, PET, and polystyrene having the deformation temperature of 100° C. or less among the above polymeric organic materials, and further, it may be most preferable to select PET having the lowest deformation temperature among them.

As long as produced or processed to have properties applicable to the processes mentioned in the present invention, those skilled in the art will not be particularly limited to using materials not selected above as the stretch film 230. For example, in the case of polypropylene (PP) films, the distribution of film properties can vary considerably depending on the processing method. For example, DCP, CPP, SCP, and the like can exhibit significant differences in tensile strength and elongation, despite using the same polypropylene raw material. In the case of PET films, the properties can vary depending on conditions such as the stretching ratio in each direction, heat setting temperature, extrusion temperature, annealing temperature, etc. As such, if there are materials other than the above selected materials currently deemed applicable, which are applicable as the stretch film depending on the manufacturing conditions, it is not excluded to use such materials as a material of the stretch film 230.

As shown in (d) of FIG. 1, the separation film 210 can be removed from the substrate 100. At this time, the LED 220 is secured to the stretch film 230.

In step (d) of FIG. 1, if the separation film 210 is composed of a conductive material, the separation film 210 can be separated from the substrate with the LED 220 attached to the separation film 210, and if the separation film 210 is composed of an insulating material, only the LED 220 can be separated from the substrate 100 with the separation film 210 attached to the substrate 100. In the present invention, it may be desirable to form the separation film 210 with a conductive material in terms of damage to the LEDs 220 or ease of electrode formation.

As shown in (e) of FIG. 1, the stretch film 230 can be stretched. The stretch film 230 can be stretched 2 to 5 times in one direction when it has an elongation of 200 to 500%, resulting in a 4 to 25 times area spread of the LEDs 220 in a plane.

In step (e) of FIG. 1, the stretch film 230 may be shape-locked in the stretched state, which may be accomplished by stretching the stretch film 230 beyond a threshold, applying heat to the stretch film 230 beyond a threshold, or the like.

For example, in the case of PET, the film can be preheated to, for example, 80 to 100° C., and the preheated PET stretch film can be stretched to 200 to 500% in the longitudinal direction first. The longitudinally stretched PET stretch film can be cooled and then stretched again to 200 to 500% at a temperature of 130 to 150° C. The stretched PET stretch film can be heat treated at 180 to 250° C. for 1 to 30 seconds and then cooled slowly. In this case, the PET stretch film can be stretched and shape-locked.

As shown in (f) of FIG. 1, a portion of the stretch film 230, namely the top, can be removed to expose the top surface of the LEDs 220. Exposure of the top surface of the LEDs 220 can be accomplished by applying a dry etching gas to the top of the stretch film 230, i.e., a dry etching method.

As shown in (g) of FIG. 1, electrodes can be formed on the top surface of the LEDs 220 and on the bottom surface of the separation film 210.

In step (g) of FIG. 1, film-type electrodes, i.e., electrodes 240, can be laminated to the top surface of the LED 220 and the bottom surface of the separation film 210. The electrode 240 may be a conductive film of Cu, Ni, Ag, Au, Co, Cu—Co, Ni—Co, Cu—Mo, Ni/Cu, Ni/Cu—Mo, or the like. In this case, a plurality of LEDs 220 may be connected to a pair of electrodes and used for illumination or the like.

In step (g) of FIG. 1, in the absence of the separation film 210, the electrodes 240 may be coupled to the top and bottom surfaces of the LEDs 220, respectively.

While the above description illustrates patterning of the separation film 210 in a manner that selectively removes the separation film, given that the growth characteristics of the LEDs 220 are dependent on the selective partitioning of the substrate 100, patterning of the separation film 210 can also be done in a manner that selectively forms a shield (growth hindering layer) on the separation film 210 by location.

FIGS. 2A and 2B are cross-sectional views illustrating first and second embodiments of an LED lighting device according to the present invention, respectively.

As shown in FIG. 2A, an LED lighting device of the first embodiment may include an LED 220, a stretch film 230, a separation film 210, electrodes 240, and the like.

The LED 220 is a light emitting layer, and may have a stacked structure of an n-type semiconductor layer, an active layer, a p-type semiconductor layer, and the like.

The LED 220 is a micro-LED, which may have a size of, for example, 10 μm*10 μm, and each LED 220 may be spaced apart by, for example, 20 to 60 μm.

The stretch film 230 supports and holds the LED 220, and may be fusedly inserted into the spacing of the LEDs 220. The stretch film 230 may be formed of a stretchable material such as TPU, PET, silicone, or the like. The stretch film 230 may be a deformed material that is stretched to 200 to 500% from its original state.

The separation film 210 may be a thin film of conductive material. The separation film 210 may have a thickness of 0.2 to 1.1 nm. If the separation film 210 is less than 0.2 nm thick, it may be difficult to form and may be difficult to peel off when separated from the substrate 100. If the thickness of the separation film 210 is greater than 1.1 nm, it may be difficult to form the LED 220 with the same crystal structure as the crystal structure of the substrate 100 when forming the LED 220 on the separation film 210.

It may be desirable for the separation film 210 to be made of graphene for thin film formation, LED 220 crystal growth, and the like. In this case, the separation film 210 may comprise one to five layers of graphene crystal thin film within the range of 0.2 to 1.1 nm thickness, with one to two layers being preferred for good growth of the LED 220 crystals, in which case the separation film 210 may have a thickness of 0.2 to 0.4 nm.

The electrode 240 is a film composed of a conductive metal, which may be a conductive material such as Cu, Ni, Ag, Au, Co, Cu—Co, Ni—Co, Cu—Mo, Ni/Cu, Ni/Cu—Mo, or the like. The electrodes 240 may be integrally (wholly) coupled to each side of a plurality of LEDs 220.

As shown in FIG. 2B, the LED lighting device of the second embodiment can be configured to include the LED 220, the stretch film 230, and the electrodes 240 by removing the separation film 210 from the LED lighting device of the first embodiment.

The LED 220, stretch film 230, and electrodes 240 are the same as the corresponding components described in the first embodiment above, so a detailed description of them is replaced by the relevant description above.

Although particular embodiments of the present invention have been shown and described, it will be understood by those skilled in the art that it is not intended to limit the present invention to the preferred embodiments, and it will be obvious to those skilled in the art that various changes and modifications may be made without departing from the spirit and scope of the invention. The scope of the present invention, therefore, is to be defined by the appended claims and equivalents thereof.

DESCRIPTION OF REFERENCE NUMERALS

100: substrate 210: separation film
220: LED 230: stretch film
240: electrode

The invention claimed is:

1. A method for manufacturing a light emitting diode (LED) lighting device, the method comprising:
   forming a separation film on a substrate;
   patterning the separation film;
   forming LEDs on the separation film;
   bonding a stretch film to top surfaces of the LEDs and spacing between the LEDs;
   separating the separation film from the substrate;
   stretching the stretch film;
   exposing the top surfaces of the LEDs; and forming electrodes on the top surfaces of the LEDs, and a bottom surface of the separation film or bottom surfaces of the LEDs.

2. The method of claim 1, wherein forming the separation film forms the separation film with a thickness of 0.2 to 1.1 nm.

3. The method of claim 2, wherein forming the separation film stacks graphene crystalline thin films in 1 to 5 layers.

4. The method of claim 3, wherein forming the separation film includes:
   forming the separation film on a copper foil; and
   transferring the separation film to the substrate.

5. The method of claim 1, wherein patterning the separation film selectively removes the separation film by location or selectively forms shields on the separation film by location.

6. The method of claim 1, wherein bonding the stretch film to the top surfaces of the LEDs and the spacing between the LEDs includes heat-pressing the stretch film.

7. The method of claim 1, wherein stretching the stretch film includes shape-locking the stretch film in a stretched state.

8. The method of claim 1, wherein exposing the top surfaces of the LEDs includes removing a portion of the stretch film.

9. The method of claim 8, wherein removing a portion of the stretch film includes dry etching the stretch film.

10. The method of claim 1, wherein forming the electrodes on the top surfaces of the LEDs, and the bottom surface of the separation film or the bottom surfaces of the LEDs includes laminating a conductive film to the top surfaces of the LEDs, and the bottom surface of the separation film or the bottom surfaces of the LEDs.

11. A light emitting diode (LED) lighting device comprising:
   a plurality of LEDs arranged spaced apart;
   a stretch film disposed in spacing between adjacent ones of the plurality of LEDs, the stretch film being coupled to side surfaces of respective ones of the plurality of LEDs to support the plurality of LEDs; and
   an electrode film laminated to at least one surface of the plurality of LEDs.

12. The LED lighting device of claim 11, further comprising a separation film bonded to one side of each of the plurality of LEDs.

13. The LED lighting device of claim 12, wherein the separation film has a thickness of 0.2 to 1.1 nm.

14. The LED lighting device of claim 13, wherein the separation film has a structure in which graphene crystalline thin films are stacked in 1 to 5 layers.

15. The LED lighting device of claim 11, wherein the stretch film uses a polymeric organic material with a difference of 40° C. or more between a melting point and deformation temperature at tensile strength of 0.46 Mpa.

16. The LED lighting device of claim 15, wherein the polymeric organic material is selected from ABS resin, nylon 6, polycarbonate, polyethylene, HDPE, PET, polypropylene, and polystyrene.

17. The LED lighting device of claim 11, wherein the stretch film uses a polymeric organic material with a difference of 60° C. or more between a melting point and deformation temperature at tensile strength of 0.46 Mpa.

18. The LED lighting device of claim 17, wherein the polymeric organic material is selected from ABS resin, nylon 6, polycarbonate, PET, polypropylene, and polystyrene.

19. The LED lighting device of claim 11, wherein the stretch film is composed of one or more polymeric organic material selected from the group consisting of an ABS resin, a PET, and a polystyrene.

20. The LED lighting device of claim 11, wherein the stretch film is composed of PET.

21. The LED lighting device of claim 11, wherein the stretch film is fusedly inserted into the spacing between adjacent ones of the plurality of LEDs.

* * * * *